United States Patent
Lu et al.

(10) Patent No.: US 9,673,696 B2
(45) Date of Patent: Jun. 6, 2017

(54) ULTRA LOW-VOLTAGE CIRCUIT AND METHOD FOR NANOPOWER BOOST REGULATOR

(71) Applicant: ANALOG DEVICES TECHNOLOGY, Hamilton (BM)

(72) Inventors: Yanfeng Lu, Shangahi (CN); Bin Shao, Shanghai (CN)

(73) Assignee: ANALOG DEVICES TECHNOLOGY, Hamilton (BM)

(*) Notice: Subject to any disclaimer, the term of this patent is extended or adjusted under 35 U.S.C. 154(b) by 299 days.

(21) Appl. No.: 14/051,702

(22) Filed: Oct. 18, 2013

(65) Prior Publication Data
US 2014/0268936 A1    Sep. 18, 2014

Related U.S. Application Data

(63) Continuation of application No. 13/974,252, filed on Aug. 23, 2013, now abandoned.

(60) Provisional application No. 61/778,836, filed on Mar. 13, 2013.

(51) Int. Cl.
*H02M 1/36* (2007.01)
*H02M 3/155* (2006.01)
*H02M 3/07* (2006.01)

(52) U.S. Cl.
CPC ............ *H02M 1/36* (2013.01); *H02M 3/155* (2013.01); *H02M 3/07* (2013.01); *H03K 2217/0081* (2013.01)

(58) Field of Classification Search
CPC .... H02M 1/36; H02M 3/33507; H02M 7/517; H02M 3/155; H02M 3/07; G05F 1/468; H03K 2217/0081
See application file for complete search history.

(56) References Cited

U.S. PATENT DOCUMENTS

| | | | | |
|---|---|---|---|---|
| 5,612,861 A | * | 3/1997 | Zhong | H02M 3/07 363/49 |
| 5,774,348 A | | 6/1998 | Druce et al. | |
| 5,831,470 A | * | 11/1998 | Park | H02M 3/073 327/536 |
| 6,020,781 A | * | 2/2000 | Fujioka | H02M 1/36 327/142 |
| 7,982,530 B2 | | 7/2011 | Byeon | |
| 2001/0017566 A1 | * | 8/2001 | Nakahara | H02M 3/07 327/536 |
| 2003/0006823 A1 | * | 1/2003 | Dohi | H02M 3/073 327/534 |
| 2005/0206441 A1 | * | 9/2005 | Kimura | H02M 3/073 327/536 |
| 2006/0256592 A1 | * | 11/2006 | Yoshida | H02M 3/073 363/59 |
| 2010/0148727 A1 | * | 6/2010 | Kwong | H02J 7/0031 320/134 |

(Continued)

*Primary Examiner* — Gustavo Rosario Benitez
(74) *Attorney, Agent, or Firm* — Patent Capital Group (57) ABSTRACT

At least one embodiment provides a method for a nanopower boost regulator to startup from an ultra-low-voltage (such as 0.3V~0.5V) for energy harvesting applications. The method does not necessarily require a special process or any external components such as mechanical switches. The startup circuit can include an asynchronous boost circuit to charge up an output with stacked power NMOS transistors, a ring oscillator, and/or a charge pump, along with accompanying circuitry.

20 Claims, 5 Drawing Sheets

Conventional Scheme (56) References Cited

U.S. PATENT DOCUMENTS

| | | | |
|---|---|---|---|
| 2010/0207455 A1* | 8/2010 | Erickson, Jr. | G05F 1/67 307/82 |
| 2011/0127978 A1* | 6/2011 | Lee | H02M 1/36 323/282 |
| 2011/0134665 A1* | 6/2011 | Ivanov | H02M 3/156 363/49 |
| 2011/0278955 A1 | 11/2011 | Signorelli et al. | |
| 2012/0049823 A1* | 3/2012 | Chen | H02M 1/36 323/282 |
| 2012/0293021 A1 | 11/2012 | Teggatz et al. | |
| 2013/0234768 A1* | 9/2013 | Murata | H03K 5/12 327/170 |

* cited by examiner

ULTRA LOW-VOLTAGE CIRCUIT AND METHOD FOR NANOPOWER BOOST REGULATOR

CROSS-REFERENCE TO RELATED APPLICATIONS

This application is a continuation of application Ser. No. 13/974,252, filed Aug. 23, 2013, which claims the benefit of U.S. Provisional Application No. 61/778,836, filed on Mar. 13, 2013. The entire contents of both of those documents are hereby incorporated by reference in their entireties.

BACKGROUND

Technical Field

This disclosure relates in general to the field of power electronics and, more particularly, to controlling an ultra-low-voltage startup circuit.

Energy harvesting, such as by way of photovoltaic (PV) cells, is becoming increasingly popular. A significant problem that virtually all energy harvesting operations have is in starting up from 0V. For example, the output voltages of some PV cell sources are only in the range of 0.3V~0.5V. However, the threshold voltage of a 5V device may be higher than this range and even higher than 1V, if considering the effects from corner variation and temperature. In addition, a low threshold voltage device is normally rejected because a special process must be used to avoid a large leakage current.

Hence, self-startup from an ultra-low-voltage for a boost regulator is important in a myriad of processing environments.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION

Overview

At least one embodiment of the present disclosure provides a method for a nanopower boost regulator to startup from an ultra-low-voltage (such as 0.3V~0.5V) for energy harvesting applications. The method does not necessarily require a special process or any external components such as mechanical switches. The startup circuit can include an asynchronous boost circuit to charge up an output with stacked power NMOS transistors, a ring oscillator, and/or a charge pump, along with accompanying circuitry.

An apparatus for providing an ultra-low-voltage startup circuit for a nanopower boost regulator is provided in one example. The apparatus includes a ring oscillator that is powered by a power supply; a first detector; a first charge pump that is driven by a clock output of the ring oscillator and that outputs a boosted voltage; a first N-type metal-oxide-semiconductor (NMOS) transistor having a gate connected to the first charge pump and that receives the boosted voltage; and a second NMOS transistor having a drain connected to a source of the first NMOS transistor and a gate that receives an input at least based on an output of the first detector.

A method is provided in one example. The method includes generating a clock output with a ring oscillator; boosting an input voltage at least based on the clock output, to produce a boosted voltage with a first charge pump; producing a detection output in response to a detection that an output of a second charge pump is higher than a designated voltage; receiving the boosted voltage at a gate of a first N-type metal-oxide-semiconductor (NMOS) transistor; and receiving at a gate of a second NMOS transistor an input at least based on the detection output, wherein a drain of the second NMOS transistor is connected to a source of the first NMOS transistor.

Example Embodiments

Figure 1:
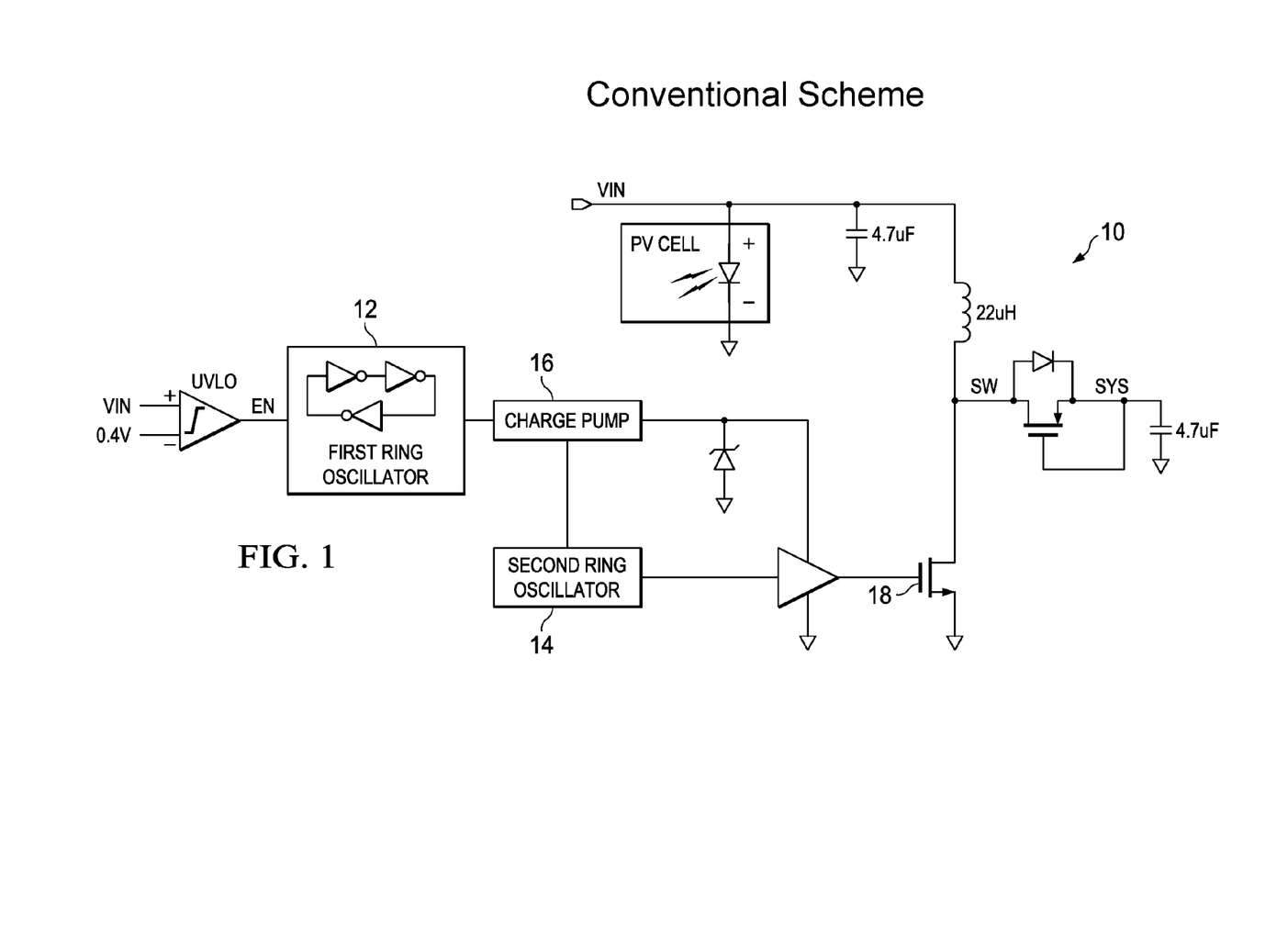
FIG. 1 is a simplified schematic diagram illustrating a conventional scheme for a cold startup of a boost regulator from an ultra-low-voltage range.

FIG. 1 illustrates a circuit 10 for a cold startup from an ultra-low-voltage range. The circuit 10 includes a first ring oscillator 12, a second ring oscillator 14, a charge pump 16, and 5V transistor 18. Due to a relatively large threshold voltage of 1V of transistor 18 and a low input voltage VIN (approximately 0.4V), the frequency of the first ring oscillator 12 is relatively low. As a result, the output current ability of charge pump 16 is also relatively low (e.g., several tens of nA). However, significant power is required during the startup of the second ring oscillator 14. Hence, it is virtually impossible for the output of the charge pump 16 to sufficiently power the second ring oscillator 14.

Some embodiments of the present disclosure enable a boost in a startup from an ultra-low-voltage (e.g., with a traditional 0.35 μm process). Further, some embodiments of the present disclosure offer a strategy in which a boost regulator charges up an output from 0V, while an input voltage is only in a 0.3V~0.5V range. Thus, certain examples provide a complete solution in energy harvesting applications for the issue of starting up from an ultra-low-voltage.

Figure 2:
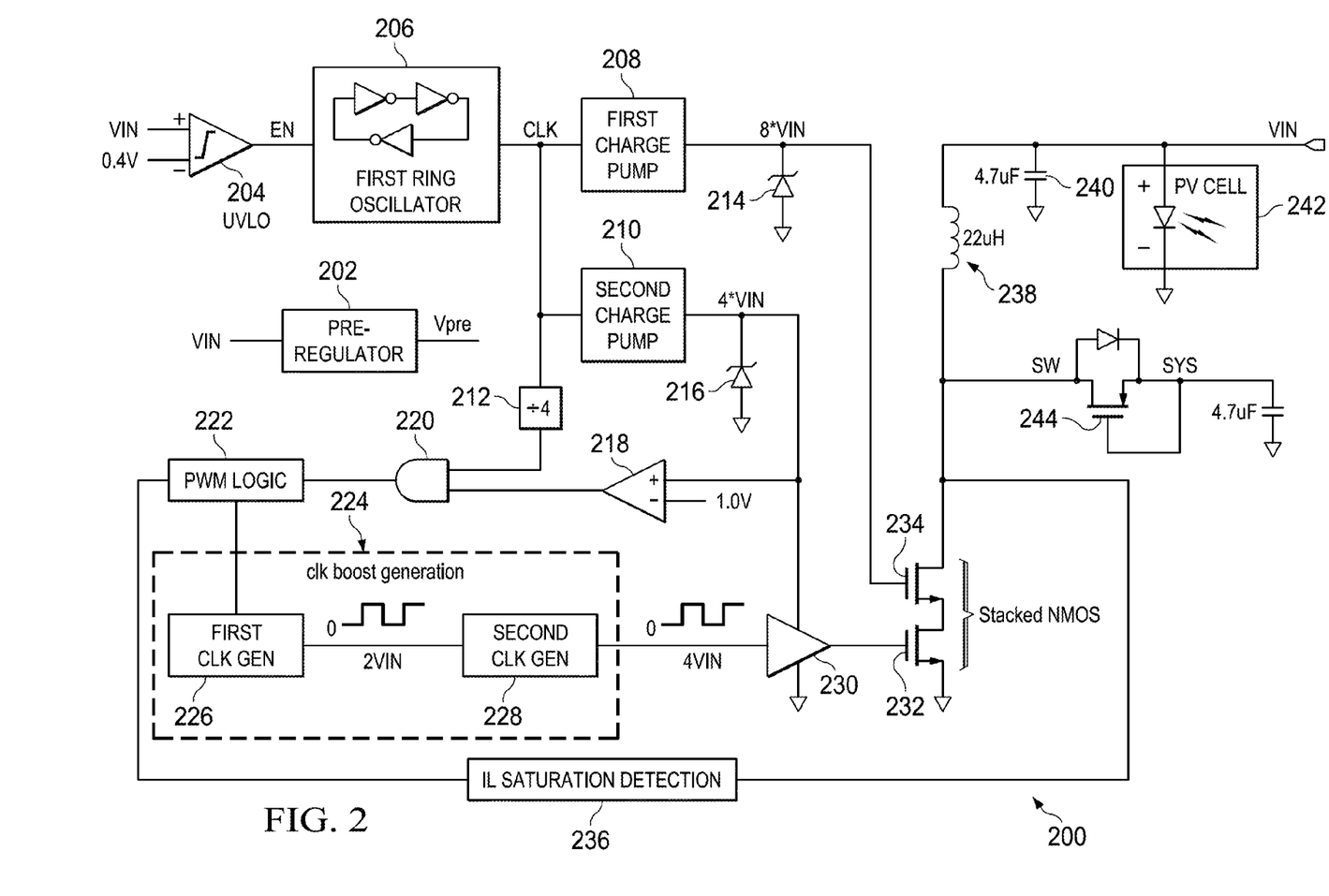
FIG. 2 is a block diagram of a startup circuit in accordance with one embodiment of the present disclosure.

FIG. 2 illustrates a block diagram of an example embodiment of a startup circuit 200. The startup circuit 200 includes a pre-regulator 202, an undervoltage lockout (UVLO) circuit 204, a ring oscillator 206, a first charge pump 208, a second charge pump 210, a clock divider 212, Zener diodes 214, 216, a detector 218, an AND gate 220, pulse-width modulation (PWM) logic 222, a clock boost generation circuit 224, a buffer 230, stacked n-channel metal-oxide-semiconductor (NMOS) field-effect transistors 232, 234, an inductor current saturation detector 236, an inductor 238, an input capacitor 240, a photovoltaic cell 242, and a p-channel metal-oxide-semiconductor (PMOS) field-effect transistor 244.

The pre-regulator 202 receives an input voltage VIN. The pre-regulator 202 outputs a regulated voltage Vpre that initially follows the input voltage VIN and clamps to approximately a threshold voltage Vth once the input voltage VIN is above the threshold voltage Vth. Thus, the pre-regulator 202 provides protection for devices that are connected to or used in the charge pumps 208, 210 from a very high input voltage VIN. The regulated voltage Vpre is used as a power supply of a startup block including ring oscillator 206 and clock boost generation circuit 224.

The UVLO circuit 204 receives the input voltage VIN and compares the input voltage VIN to a predetermined value, such as 0.35V or 0.4V. If the input voltage VIN rises above the predetermined value, the ring oscillator 206 and the first and second charge pumps 208, 210 are enabled by a signal EN output by UVLO circuit 204. If the input voltage VIN falls below the predetermined value, the UVLO circuit 204 disables the ring oscillator 206 by not outputting the signal EN. Thus, if input voltage VIN falls below a threshold voltage of the UVLO circuit 204, the NMOS transistor 232 will be turned off.

The ring oscillator 206 is powered by regulated voltage Vpre and generates a clock signal CLK. In one embodiment, the ring oscillator 206 generates clock signal CLK with a feedback loop including an odd number of NOT gates, such as three. The inherent delays of the NOT gates determines the frequency of clock signal CLK. The clock signal CLK drives the first charge pump 208, the second charge pump 210, and the clock divider 212.

The clock divider 212 divides clock signal CLK by a predetermined value, such as 4. Of course, the clock divider can divide clock signal CLK by other values, depending on the frequency of clock signal CLK.

The first charge pump 208 outputs a boosted voltage of 8*VIN in this particular example. Other output values, such as 10*VIN, can be used. Zener diode 214 at the output of the first charge pump 208 prevents the output of the first charge pump 208 from rising above 5.5V.

The second charge pump 210 outputs a boosted voltage of 4*VIN in this specific implementation. Other output values can be used. Zener diode 216 at the output of the second charge pump 210 prevents the output from rising too high.

Voltage detector 218 is connected to the output of the second charge pump 210 but does not require current therefrom. Detector 218 outputs a signal to AND gate 220 once detector 218 detects that the output of the second charge pump 210 is higher than a predetermined value. This signal causes clock boost generation circuit 224 to begin to operate. This predetermined value corresponds to a threshold voltage of NMOS transistor 232. In other words, the detector 218 determines whether the output of the second charge pump 210 is sufficient to turn NMOS transistor 232 on. In one embodiment, the predetermined value is 1V. Of course, other values can be used. Further, detector 218 does not require current from the second charge pump 210.

AND gate 220 receives the output of clock divider 212 and the output of detector 218. AND gate 220 outputs a signal to PWM logic 222 indicating, for example, when both the divided clock signal CLK is high and the output of the second charge pump 210 is higher than the predetermined value.

PWM logic 222 receives the signal output from AND gate 220 and receives a signal from inductor current saturation detector 236. The PWM logic 222 modulates the pulse width of the signal from AND gate 220 based on the signal from the inductor current saturation detector 236. Based thereon, the PWM logic outputs a signal to the clock boost generation circuit 224.

Clock boost generation circuit 224 receives the pulse-width modulated signal from PWM logic 222 and increases the amplitude of clock signal CLK. The clock boost generation circuit 224 includes a first clock gen unit 226 and a second clock gen unit 228. Exemplary schematic diagrams illustrating the structures of the first clock gen unit 226 and second clock gen unit 228 are set forth below.

Clock boost generation circuit 224 increases the high value of clock signal CLK to a value that is a product of a predetermined integer and input voltage VIN. The clock boost generation circuit 224 maintains the low value of clock signal CLK at a predetermined voltage, such as 0V.

More specifically, the first clock gen unit 226 increases the high value of clock signal CLK to a value that is a product of a predetermined integer and input voltage VIN. For example, the first clock gen unit 226 can increase the high value of clock signal CLK to 2*VIN or 3*VIN. The first clock gen unit 226 outputs this increased-amplitude signal to the second clock gen unit 228.

The second clock gen unit 228 increases the high value of the increased-amplitude signal to a value that is a product of a predetermined integer and input voltage VIN. In one embodiment, the predetermined integer is 4. In other embodiments, the predetermined integer is 5, 6, 7, etc. The second clock gen unit 228 outputs this second-increased-amplitude signal to the buffer 230.

The buffer 230 receives power from the boosted voltage output by the second charge pump 210. The buffer 230 outputs to a gate of NMOS transistor 232, which is a bottom one of the two stacked NMOS transistors 232, 234. In this way, buffer 230 electrically isolates the stacked NMOS transistors 232, 234 from clock boost generation circuit 224 and second charge pump 210.

NMOS transistor 232 is a medium threshold voltage (e.g., 3V) device. A source of NMOS transistor 232 is connected to a drain of NMOS transistor 234. A drain of NMOS transistor 232 is connected to a predetermined reference voltage, such as ground.

NMOS transistor 234 is a 5V native NMOS transistor. The gate of NMOS transistor 234 is connected to the first charge pump 208 and receives a boosted voltage therefrom. A source of NMOS transistor 234 is connected to a node SW. Because the 5V native NMOS transistor 234 separates NMOS transistor 232 from node SW, the medium 3V NMOS transistor 232 will not be damaged by a possible 5V at node SW.

It is possible to replace NMOS transistors 232, 234 with a single 5V transistor. However, such a transistor requires a comparatively high gate drive voltage to turn the transistor on. In contrast, implementing the circuit with the stacked NMOS transistors 232, 234 relaxes that requirement, while making it easier to survive under the stress of 5V.

Further, the threshold voltage of the 5V native NMOS transistor 234 is negative. If a single 5V device is used instead of the stacked NMOS transistors 232, 234, in a worst case, the threshold voltage of the 5V device will be higher than 1V. However, it is difficult to make voltage detector 218 have a threshold much higher than 1V.

Also connected to the node SW are an input to inductor current saturation detector 236, a drain of PMOS transistor 244, an input to a diode, and one end of inductor 238. The inductor current saturation detector 236 operates as follows: once the current through inductor 238 is saturated due to a large ON resistance of NMOS transistor 232, the inductor current saturation detector 236 outputs a signal to PWM logic 222. PWM logic 222 then outputs a signal to clock boost generation circuit 224 such that buffer 230 will turn off the NMOS transistor 232. Thus, if the voltage at the node SW is high enough to near the input voltage VIN (due to the large ON resistance of the stacked NMOS transistors 232, 234), then NMOS transistor 232 will be turned off (e.g., immediately).

A gate and a source of PMOS transistor 244 are connected together at an output node SYS. The diode is connected in parallel with PMOS transistor 244, from the node SW to the output node SYS. An output capacitor is connected between the output node SYS and a predetermined voltage, such as ground. In one embodiment, the output capacitor has a value of 4.7 µF, although other values can be used.

In one implementation, a drain of another PMOS transistor is connected to the output node SYS, while a source and a gate of that PMOS transistor is connected to a rechargeable battery. A diode is connected from the drain of that PMOS transistor to the source thereof.

Inductor 238 connects from node SW to input voltage VIN. In one embodiment, the inductor has a value of 220, although other values can be used.

Also connected to input voltage VIN are input capacitor 240 and a photovoltaic cell 242. The other end of input capacitor 240 is connected to a predetermined voltage, such as ground. Similarly, the other end of photovoltaic cell 242 is connected to the predetermined voltage. The power from PV cell 242 is relatively small, and the PV cell 242 charges up input capacitor 240.

Inductor 238, PMOS transistor 244, and NMOS transistors 232, 234 form an asynchronous boost regulator. Normally, PMOS transistor 244 is off, and the asynchronous boost regulator works in a discontinuous conduction mode (DCM). Thus, the work process can be instantiated as two phases: in the first phase, PV cell 242 charges input capacitor 240, and, in the second phase, the power stored at input capacitor 240 is transferred to the output through the asynchronous boost regulator.

Figure 3:
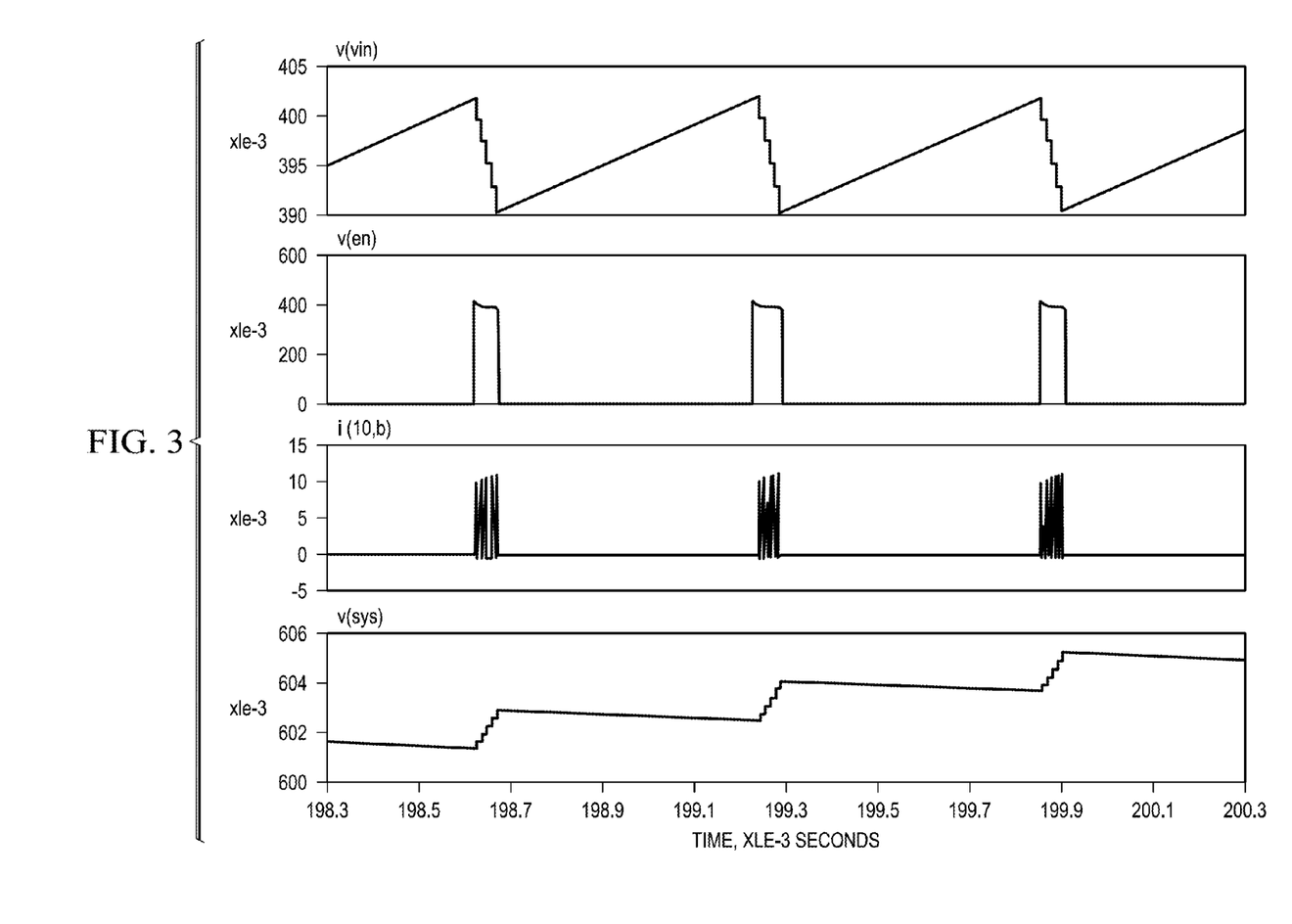
FIG. 3 is an example waveform depicting the operation of a startup circuit in accordance with one embodiment of the present disclosure.

FIG. 3 illustrates an example waveform depicting how startup circuit 200 operates. FIG. 3 illustrates that v(en), representing the enable output by UVLO circuit 204, rises after input voltage VIN, represented by v(vin), reaches a predetermined level. While v(en) is enabled (e.g., is high), the current through inductor 238, represented by i(10,b), periodically rises. This current causes the voltage at output node SYS, represented as v(sys) to rise. Once v(sys) reaches a predetermined voltage, cold startup ends.

Figure 4A:
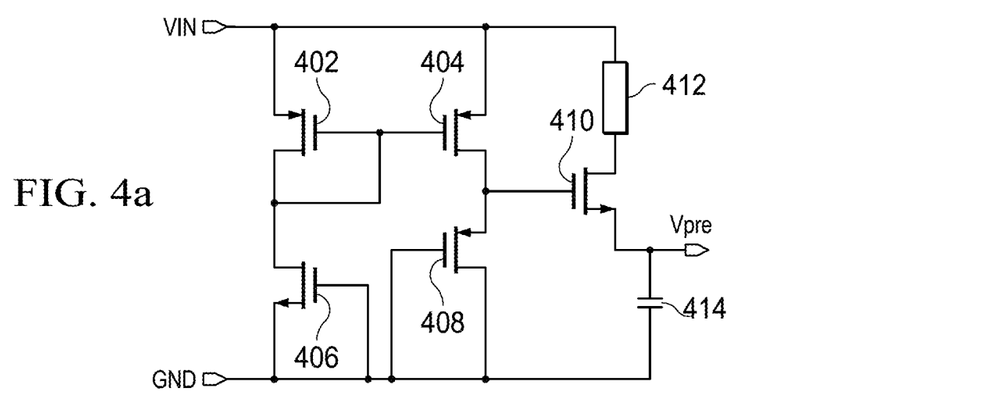
FIG. 4a is a simplified schematic diagram illustrating the structure of a pre-regulator in accordance with one embodiment of the present disclosure.

FIG. 4a is a simplified schematic diagram illustrating the structure of pre-regulator 202. As shown in FIG. 4A, pre-regulator 202 includes PMOS transistors 402, 404, 408, NMOS transistors 406, 410, resistor 412, and capacitor 414. In the illustrated embodiment, PMOS transistors 402, 404 are medium 3V devices, PMOS transistor 408 is a normal 3V device, and NMOS transistors 406, 410 are native 5V devices.

Sources of PMOS transistors 402, 404 connect to input voltage VIN. A gate of PMOS transistor 402 connects to a drain thereof, as well as a gate of PMOS transistor 404. Thus, PMOS transistors 402 and 404 are connected in a current mirror configuration.

A drain of NMOS transistor 406 is connected to a gate and a drain of PMOS transistor 402. A gate and a source of NMOS transistor 406 are connected to ground. A source of PMOS transistor 408 is connected to a drain of PMOS transistor 404. A gate and a drain of PMOS transistor 408 are connected to ground.

One end of resistor 412 is connected to input voltage VIN. The other end of resistor 412 is connected to a drain of NMOS transistor 410. A gate of NMOS transistor 410 is connected to a source of PMOS transistor 408 and a drain of PMOS transistor 404. A source of NMOS transistor 410 connects to the output Vpre, as well as grounded capacitor 414.

Figure 4B:
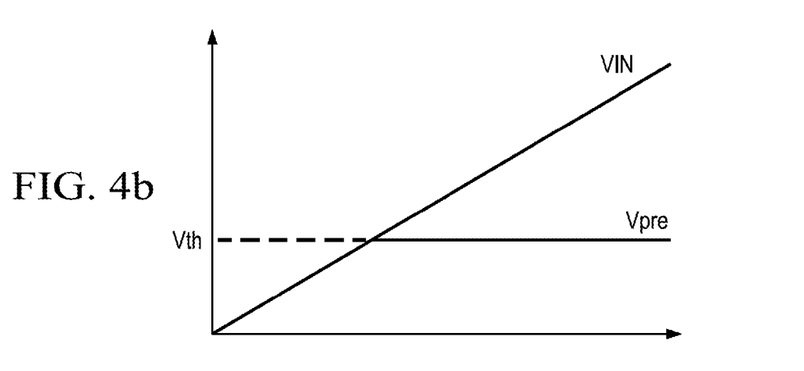
FIG. 4b is a graph illustrating an output of the pre-regulator as a function of input voltage in accordance with one embodiment of the present disclosure.

FIG. 4b illustrates that the output voltage Vpre is clamped to be about threshold voltage Vth when the input voltage VIN is relatively high (e.g., higher than Vth). This is mainly for protection in the case that the input terminal is connected to a strong power source (e.g., a 3V ideal voltage source). In this case, the system can prevent the output of the second charge pump 210 and the clock boost generation circuit 224 from voltages above 3V to protect any 3V devices.

To make the ON resistance of a medium 3V device (e.g., NMOS transistor 232) small enough, the system should guarantee that a gate voltage of such a 3V device is much higher than the threshold voltage Vth thereof. In the worst-case scenario, the threshold voltage Vth of the medium NMOS transistor 232 is still no more than 0.5V. Thus, a gate voltage of the present disclosure is sufficient to turn on NMOS transistor 232.

Figure 5:
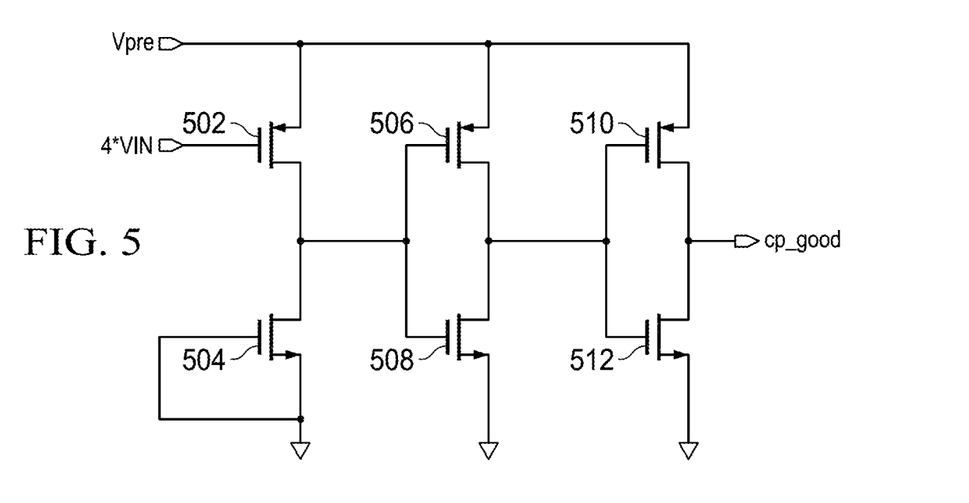
FIG. 5 is a simplified schematic diagram illustrating the structure of a voltage detector in accordance with one embodiment of the present disclosure.

FIG. 5 is a simplified schematic diagram illustrating the structure of detector 218 in accordance with one embodiment. Detector 218 includes NMOS transistors 502, 504, 508, 512 and PMOS transistors 506, 510. NMOS transistor 502 is a 5V device. NMOS transistor 504 is a native 5V device. NMOS transistors 508, 512 and PMOS transistors 506, 510 are medium 3V devices.

Detector 218 receives, e.g., the boosted 4*VIN signal from the second charge pump 210 at a gate of NMOS transistor 502. The NMOS transistor 502 has its bulk connected to its source. A drain of NMOS transistor 502 is connected to regulated voltage Vpre. A source of NMOS transistor 502 is connected to a drain of NMOS transistor 504. A gate and source of NMOS transistor 504 are connected to a reference voltage, such as ground.

A source of NMOS transistor 502 and a drain of NMOS transistor 504 are connected to gates of PMOS transistor 506 and NMOS transistor 508. A source of PMOS transistor 506 is connected to regulated voltage Vpre. A source of NMOS transistor 508 is connected to the reference voltage. A drain of PMOS transistor 506 and a drain of NMOS transistor 508 are connected together and are also connected to gates of PMOS transistor 510 and NMOS transistor 512.

A source of PMOS transistor 510 is connected to regulated voltage Vpre. A source of NMOS transistor 512 is connected to the reference voltage. A drain of PMOS transistor 510 and a drain of NMOS transistor 512 are connected together and are also connected to output cp_good.

Other implementations can be used. For example, in one implementation, the voltage detector 218 is an operational amplifier.

Figure 6A:
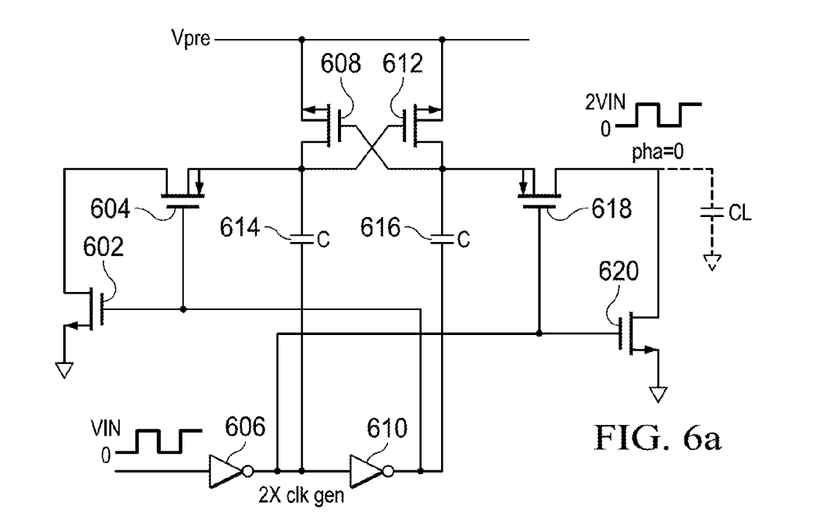
FIG. 6a is a simplified schematic diagram illustrating the structure of a first clock gen unit in accordance with one embodiment of the present disclosure.
Figure 6B:
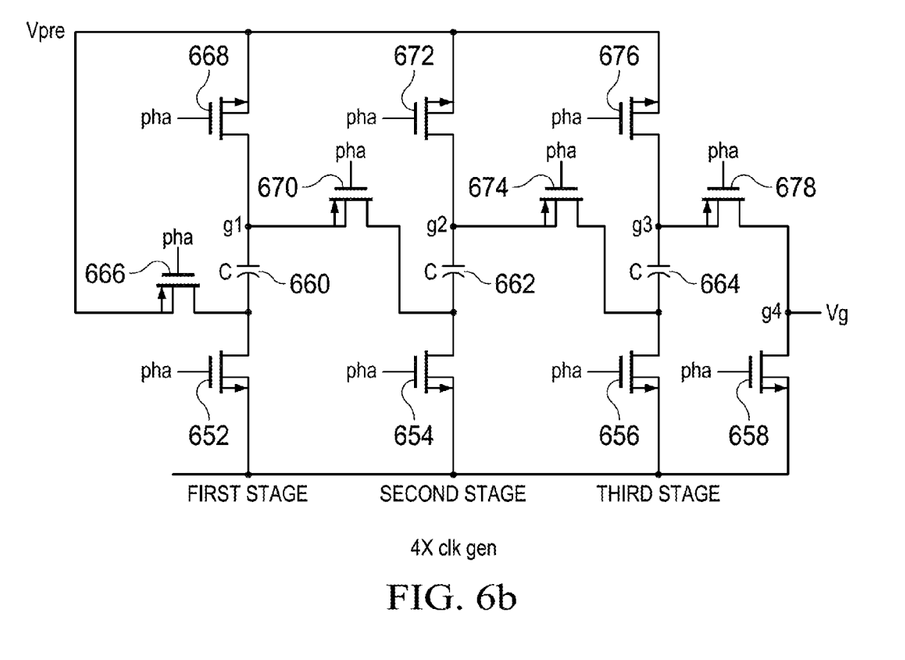
FIG. 6b is a simplified schematic diagram illustrating the structure of a second clock gen unit in accordance with one embodiment of the present disclosure.

FIG. 6 illustrates example implementations of first clock gen unit 226 and second clock gen unit 228 of clock boost generation circuit 224. Clock boost generation circuit 224 generates a clock having a high value much higher than input voltage VIN. The first clock gen unit 226 generates a clock having a high value of, e.g., 2*VIN. The second clock gen unit 228 receives the increased-amplitude signal from the first clock gen unit 226 and generates a clock having a high value of, e.g., 4*VIN.

FIG. 6a is a simplified schematic diagram illustrating the structure of first clock gen unit 226. The first clock gen unit 226 includes NMOS transistors 602, 608, 612, 620, PMOS transistors 604, 618, inverters 606, 610, and capacitors 614, 616.

The first clock gen unit 226 receives input voltage VIN as the input of inverter 606. The output of inverter 606 is coupled to one end of capacitor 614 and the input of inverter 610. The other end of capacitor 614 is connected to a drain of NMOS transistor 608. The NMOS transistor 608 has its bulk connected to its source. The source of NMOS transistor 608 is also connected to regulated voltage Vpre.

The output of inverter 610 is connected to one end of capacitor 616. The other end of capacitor 616 is connected to a drain of NMOS transistor 612. The NMOS transistor 612 has its bulk connected to its source. A source of NMOS transistor 612 is also connected to regulated voltage Vpre.

A gate of NMOS transistor 612 is connected to a source of PMOS transistor 604. The PMOS transistor 604 has its bulk connected to its source. A drain of PMOS transistor 604 is connected to a drain of NMOS transistor 602. A gate of PMOS transistor 604 is connected to a gate of NMOS transistor 602. A source of NMOS transistor 602 is connected to a reference voltage, such as ground.

A gate of NMOS transistor 608 is connected to a source of PMOS transistor 618. The PMOS transistor 618 has its bulk connected to its source. A drain of PMOS transistor 618 is connected to a drain of NMOS transistor 620. A gate of PMOS transistor 618 is connected to a gate of NMOS transistor 620. A source of NMOS transistor 620 is connected to the reference voltage.

A capacitative load, CL, can be seen from the drain of NMOS transistor 620. The output of the first clock gen unit 226 is a signal pha.

FIG. 6b is a simplified schematic diagram illustrating the structure of a second clock gen unit 228. As shown in FIG. 6B, the second clock gen unit 228 includes NMOS transistors 652, 654, 656, 658, 668, 672, 676, PMOS transistors 666, 670, 674, 678, and capacitors 660, 662, 664. NMOS transistors 652, 654, 656, 658, 668, 672, 676 and PMOS transistors 666, 670, 674, 678 have their bulks connected to their sources. Further, NMOS transistors 652, 654, 656, 658, 668, 672, 676 and PMOS transistors 666, 670, 674, 678 have their gates connected to the signal pha. Sources of NMOS transistors 652, 654, 656, and 658 are connected to a reference voltage.

In the first stage, a drain of NMOS transistor 652 connects to a negative end of capacitor 660 and to a drain of PMOS transistor 666. A source of PMOS transistor 666 is connected to regulated voltage Vpre. The positive end of capacitor 660 is connected to node g1. Also connected to node g1 are a drain of NMOS transistor 668 and a source of PMOS transistor 670. A source of NMOS transistor 668 is connected to regulated voltage Vpre. A drain of PMOS transistor 670 is connected to a negative end of capacitor 662.

In the second stage, a drain of NMOS transistor 654 also connects to the negative end of capacitor 662. The positive end of capacitor 662 is connected to a node g2. Also connected to node g2 are a drain of NMOS transistor 672 and a source of PMOS transistor 674. A source of NMOS transistor 672 is connected to regulated voltage Vpre. A drain of PMOS transistor 674 is connected to a negative end of capacitor 664.

In the third stage, a drain of NMOS transistor 656 also connects to the negative end of capacitor 664. The positive end of capacitor 664 is connected to node g3. Also connected to node g3 are a drain of NMOS transistor 676 and a source of PMOS transistor 678. A source of NMOS transistor 676 is connected to regulated voltage Vpre. A drain of PMOS transistor 678 outputs a voltage Vg at output node g4, which connects to the buffer 230. Output node g4 is also connected to a drain of NMOS transistor 658.

Thus, even if the ring oscillator 206 has a low frequency, the clock boost generation circuit 224 can increase the swing of the clock signal CLK.

Modifications

The activities discussed above with reference to the FIGURES are applicable to any integrated circuits that involve low-voltage startup, particularly those that can execute specialized software programs or algorithms. Certain embodiments relate to multi-DSP signal processing, floating point processing, signal/control processing, fixed-function processing, microcontroller applications, etc.

In certain contexts, the features discussed herein are applicable to PV cell and thermoelectric generation (TEG) energy harvesting, indoor environmental monitoring, wireless sensor networks, indoor environmental monitoring, data acquisition systems, industrial and instrumentation applications, and healthcare and medical applications, and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

In the discussions of the embodiments above, the NMOS and PMOS transistors, power sources, amplifiers, inverters, resistors, logic, buffers, and/or capacitors can readily be replaced, substituted, or otherwise modified to accommodate particular circuitry needs. For example, the field-effect transistors can be replaced by bipolar junction transistors (BJTs). Moreover, the use of complementary electronic devices, hardware, software, etc. offers an equally viable option for implementing the teachings of the present disclosure.

In one example embodiment, any number of electrical circuits of the FIGURES are implemented on a motherboard of an associated electronic device. The motherboard can be a general circuit board that holds various components of the internal electronic system of the electronic device and, further, provides connectors for other peripherals. More specifically, the motherboard can provide the electrical connections by which other components of the system can communicate electrically. Any suitable processors (inclusive of digital signal processors, microprocessors, supporting chipsets, etc.), memory elements, etc. can be suitably coupled to the motherboard based on particular configuration needs, processing demands, computer designs, etc. Other components such as external storage, sensors, controllers for audio/video display, and peripheral devices can be attached to the motherboard as plug-in cards, via cables, or integrated into the motherboard itself.

In another example embodiment, the electrical circuits of the FIGURES are implemented as stand-alone modules (e.g., a device with associated components and circuitry configured to perform a specific application or function) or implemented as plug-in modules into application specific hardware of electronic devices. Particular embodiments of the present disclosure can be readily included in a system on chip (SOC) package, either in part or in whole. An SOC represents an IC that integrates components of a computer or other electronic system into a single chip. It can contain digital, analog, mixed-signal, and radio frequency function, all of which can be provided on a single chip substrate. Other embodiments can include a multi-chip-module (MCM), with a plurality of separate ICs located within a single electronic package and configured to interact with each other through the electronic package. In various other embodiments, the amplification functionalities are implemented in one or more silicon cores in Application Specific Integrated Circuits (ASICs), Field Programmable Gate Arrays (FPGAs), and other semiconductor chips.

All of the specifications, dimensions, and relationships outlined herein (e.g., the number of clock generators, charge pumps, MOSFETs, logic operations, etc.) have only been offered for purposes of example and teaching only. Such information can be varied considerably without departing from the spirit of the present disclosure or the scope of the appended claims. The specifications apply only to one non-limiting example and, accordingly, they should be construed as such. In the foregoing description, example embodiments are described with reference to particular processor and/or component arrangements. Various modifications and changes can be made to such embodiments without departing from the scope of the appended claims. The description and drawings are, accordingly, to be regarded in an illustrative rather than in a restrictive sense.

With the numerous examples provided herein, interactions are described in terms of two, three, four, or more electrical components. However, this has been done for purposes of clarity and example only. It should be appreciated the system can be consolidated in any suitable manner. Along similar design alternatives, any of the illustrated components, modules, and elements of the FIGURES can be combined in various possible configurations, all of which are clearly within the broad scope of this disclosure. In certain cases, it may be easier to describe one or more of the functionalities of a given set of flows by only referencing a limited number of electrical elements. The electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean any such features are included in one or more embodiments of the present disclosure, but may or may not necessarily be combined in the same embodiments.

The "means for" in these instances (above) can include (but is not limited to) using any suitable component discussed herein, along with any suitable software, circuitry, computer code, logic, algorithms, hardware, controller, interface, etc. In one example, the system includes a medium that comprises machine-readable instructions that, when executed by a processor, cause the processor to perform any of the activities discussed above. Such a medium can be transitory (e.g., implemented solely in software or a propagating wave) or non-transitory (e.g., RAM, ROM, an optical disk, a magneto-optical disk, a hard drive).

Numerous other changes, substitutions, variations, alterations, and modifications can be ascertained to one skilled in the art, and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. section 112(f) as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. An apparatus for providing an ultra-low-voltage startup for energy harvesting, the apparatus comprising:
   a ring oscillator that is powered by a power supply;
   a first charge pump that is driven by a clock output of the ring oscillator and that outputs a boosted voltage;
   a second charge pump to produce an output, wherein a boosted clock signal is generated by a clock boost generation element, when the output of the second charge pump is higher than a designated voltage;
   a first N-type metal-oxide-semiconductor (NMOS) transistor having a gate connected to the first charge pump and that receives the boosted voltage; and
   a second NMOS transistor in series with the first NMOS transistor, the second NMOS transistor having a drain connected to a source of the first NMOS transistor and a gate that receives an input at least based on the boosted clock signal.

2. The apparatus of claim 1, further comprising:
   a capacitor, wherein one or more photovoltaic cells charge up the capacitor with an input voltage.

3. The apparatus of claim 1, further comprising:
an undervoltage lockout (UVLO) unit that enables the ring oscillator, once an input voltage to the UVLO unit is higher than an undervoltage lockout threshold.

4. The apparatus of claim 1, further comprising:
a clock boost generation element, wherein, when an output of the second charge pump is higher than the designated voltage, the clock boost generation element, which includes a first clock gen unit and a second clock gen unit, begins to work.

5. The apparatus of claim 1, further comprising:
a detector, wherein, if a voltage at a drain of the first NMOS transistor nears an input voltage, the detector outputs a signal to turn off the second NMOS transistor.

6. The apparatus of claim 1, wherein an asynchronous boost regulator works in a discontinuous conduction mode, and an associated work process is concluded as two phases, wherein, in a first phase, a PV cell charges an input capacitor, and, in a second phase, power stored at the input capacitor is transferred to an output through the asynchronous boost regulator.

7. The apparatus of claim 1, further comprising:
a buffer that outputs to the gate of the second NMOS transistor.

8. The apparatus of claim 1, further comprising:
a clock boost generation element configured to generate a clock having a high value higher than an input voltage while a detector consumes no power from the second charge pump.

9. The apparatus of claim 1, further comprising:
a clock boost generation element that includes a first clock gen unit configured to generate a clock having a high value twice an input voltage, and a second clock gen unit that receives the clock having the high value twice the input voltage and is configured to generate a clock having a high value quadruple the input voltage.

10. The apparatus of claim 1, wherein the second charge pump is driven by the clock output of the ring oscillator.

11. The apparatus of claim 1, further comprising:
a clock boost generation element that increases a swing of the clock output.

12. The apparatus of claim 1, further comprising:
a clock boost generation element; and
a buffer that receives an output of the clock boost generation element and outputs to the gate of the second NMOS transistor.

13. The apparatus of claim 1, further comprising:
an inductor current saturation detector, wherein, once a current through an inductor connected to a drain of the first NMOS transistor is saturated, the inductor current saturation detector outputs a signal to turn off the second NMOS transistor.

14. The apparatus of claim 1, further comprising:
a zener diode at an output of the first charge pump to prevent the output of the first charge pump from rising above a designated level.

15. The apparatus of claim 1, further comprising:
a clock boost generation element; and
a pre-regulator configured to clamp an input voltage to a first designated voltage, thereby preventing an output of the second charge pump and the clock boost generation element from being greater than a second designated voltage.

16. The apparatus of claim 5, wherein the voltage at the drain of the first NMOS transistor nears an input voltage due to an on resistance of the first and second NMOS transistors or if the input voltage falls below a threshold of a UVLO.

17. The apparatus of claim 13, wherein the current through the inductor saturates due to an on resistance of the second NMOS transistor.

18. A method implemented by an ultra-low-voltage startup for energy harvesting, the method comprising:
generating a clock output with a ring oscillator;
boosting an input voltage at least based on the clock output, to produce a boosted voltage with a first charge pump;
producing an output of a second charge pump, wherein a boosted clock signal is generated by a clock boost generation element, when the output of the second charge pump is higher than a designated voltage;
receiving the boosted voltage at a gate of a first N-type metal-oxide-semiconductor (NMOS) transistor; and
receiving, at a gate of a second NMOS transistor, the second NMOS transistor in series with the first NMOS transistor, an input at least based on the boosted clock signal, wherein a drain of the second NMOS transistor is connected to a source of the first NMOS transistor.

19. The method of claim 18, further comprising:
clamping an input voltage to a first designated voltage to prevent outputs of the second charge pump and a clock boost generation element from being above a second designated voltage.

20. The method of claim 18, further comprising:
generating a clock having a high value twice an input voltage; and
generating a clock having a high value quadruple the input voltage, at least based on the clock having the high value twice the input voltage.

* * * * *